US012017293B2

(12) United States Patent
Deng et al.

(10) Patent No.: US 12,017,293 B2
(45) Date of Patent: Jun. 25, 2024

(54) ELECTROCHEMICAL MECHANICAL POLISHING AND PLANARIZATION EQUIPMENT FOR PROCESSING CONDUCTIVE WAFER SUBSTRATE

(71) Applicant: HANGZHOU SIZONE ELECTRONIC TECHNOLOGY INC., Zhejiang (CN)

(72) Inventors: Yaomin Deng, Zhejiang (CN); Zhengting Zhu, Zhejiang (CN); Donghui Wang, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 0 days.

(21) Appl. No.: 18/156,396

(22) Filed: Jan. 19, 2023

(65) Prior Publication Data

US 2024/0149361 A1 May 9, 2024

(30) Foreign Application Priority Data

Nov. 3, 2022 (CN) .......................... 202211372534.8

(51) Int. Cl.
*B24B 37/04* (2012.01)
*B23H 3/10* (2006.01)
(Continued)

(52) U.S. Cl.
CPC ................. *B23H 5/06* (2013.01); *B23H 3/10* (2013.01); *B24B 37/046* (2013.01); *H01L 21/32125* (2013.01); *B23H 2500/00* (2013.01)

(58) Field of Classification Search
CPC .... H01L 21/32125; B24B 37/046; B23H 5/06
See application file for complete search history.

(56) References Cited

U.S. PATENT DOCUMENTS 5,911,619 A 6/1999 Uzoh et al.
6,464,855 B1 10/2002 Chadda et al.
(Continued)

FOREIGN PATENT DOCUMENTS

CN 110197789 A * 9/2019 ........... H01L 21/304
CN 114654380 6/2022
(Continued)

OTHER PUBLICATIONS

"Search Report of Europe Counterpart Application", issued on Aug. 25, 2023, p. 1-p. 9.
(Continued)

*Primary Examiner* — Nicholas A Smith
(74) *Attorney, Agent, or Firm* — JCIPRNET

(57) ABSTRACT

The invention discloses an electrochemical mechanical polishing/planarization equipment for processing a polishing surface of a conductive wafer substrate, which includes a power supply; a polishing table with conductivity; a polishing pad including an insulating active layer and having holes where a conductive chemical liquid is accommodated; a polishing head having conductivity and being attached to the back of the polishing surface. The power supply, the polishing table, the chemical liquid, the conductive wafer substrate, and the polishing head in sequence form a conductive loop, and an electrochemical reaction layer is formed on the polishing surface of the conductive wafer substrate. The polishing head drives the wafer substrate to move relative to the polishing pad, and to implement a mechanical polishing or a chemical mechanical polishing of the electrochemical reaction layer.

16 Claims, 5 Drawing Sheets

(51) Int. Cl.
*B23H 5/06* (2006.01)
*H01L 21/321* (2006.01)

(56) References Cited

U.S. PATENT DOCUMENTS

| | | | |
|---|---|---|---|
| 2002/0148732 A1 | 10/2002 | Emesh et al. | |
| 2004/0163946 A1* | 8/2004 | Chang | B23H 5/08 |
| | | | 204/224 M |
| 2008/0014709 A1* | 1/2008 | Wang | B23H 5/08 |
| | | | 438/424 |
| 2008/0188162 A1 | 8/2008 | Kobata et al. | |
| 2008/0293343 A1* | 11/2008 | Wang | B24B 37/046 |
| | | | 451/508 |
| 2010/0059390 A1* | 3/2010 | Li | B24B 37/046 |
| | | | 205/640 |
| 2012/0244649 A1* | 9/2012 | Sano | B24B 37/10 |
| | | | 438/692 |

FOREIGN PATENT DOCUMENTS

| | | |
|---|---|---|
| EP | 1362670 | 11/2003 |
| WO | 2009048099 | 4/2009 |

OTHER PUBLICATIONS

"Office Action of Europe Counterpart Application", issued on Apr. 4, 2024, p. 1-p. 5.
"Office Action of Taiwan Counterpart Application", issued on Mar. 29, 2024, p. 1-p. 16.

\* cited by examiner

ELECTROCHEMICAL MECHANICAL POLISHING AND PLANARIZATION EQUIPMENT FOR PROCESSING CONDUCTIVE WAFER SUBSTRATE

CROSS-REFERENCE TO RELATED APPLICATION

This application claims the priority benefit of China application serial no. 202211372534.8, filed on Nov. 3, 2022. The entirety of the above-mentioned patent application is hereby incorporated by reference herein and made a part of this specification.

BACKGROUND

Technical Field

The invention belongs to the field of semiconductor integrated circuit chip manufacturing, and particularly, to electrochemical mechanical polishing and planarization equipment for processing a conductive wafer substrate.

Description of Related Art

The manufacturing of wafer substrates and semiconductor devices can include polishing and surface planarization processes, such as mechanical polishing, chemical mechanical polishing or planarization. In a conventional chemical mechanical polish/planarization (CMP) process, a wafer substrate carrier head (polishing head) pushes on the back of a wafer substrate, and the front surface of the wafer substrate or a wafer front surface film is polished or planarized on a polishing pad with a polishing slurry. Key factors in a CMP process can include polishing slurry formulation, polishing slurry flow rate, polishing head pressure, polishing head rotation speed, polishing table rotation speed, etc. Compared with a mechanical polishing process, a CMP process involves chemical reactions on the surface of the wafer substrate, and can result in a higher polishing efficiency, lower surface defectivity, better planarization performance, etc.

Conductive wafer substrates can be divided into bulk phase conductive type (a conductive substrate) and surface conductive type (a wafer substrate with a conductive surface layer). The material of the bulk phase conductive wafer substrate has good electrical conductivity, such as doped 4H-silicon carbide (SiC), etc. The surface conductive type wafer substrate can be non-conductive in the bulk phase, but the surface layer is conductive, such as metal thin films deposited on a silicon wafer.

The polishing/planarization process of a conductive substrate or a wafer substrate with a conductive surface layer can adopt electrochemical mechanical polishing/planarization technology. Based on chemical mechanical polishing/planarization, electrochemical mechanical polishing/planarization can further take advantage of the conductive properties of the wafer substrates to form a current path, and electrochemical reactions can take place on the wafer substrate or on the surface film. The surface chemical reaction rate can be increased, thereby improving the efficiency of polishing/planarization processes. In an electrochemical mechanical polishing/planarization process, polishing slurry that implements (chemical) mechanical polishing/planarization functions can also serve as the electrolyte that implements the electrochemical reaction on the wafer substrate surface, and both chemical composition and conductivity of the slurry are key factors in an electrochemical mechanical polishing/planarization process.

Some wafer substrates such as silicon carbide have a high materials hardness. If a simple mechanical polishing is used to grind the wafer surface on a polishing pad, a high polishing pressure is required, the removal rate is low, resulting in a low equipment production efficiency, a high consumption of consumables such as polishing pads, and a high total cost of polishing process. In comparison, in a chemical mechanical polishing process, the silicon carbide surface can be chemically modified such as being oxidized, the surface hardness can be reduced, thereby the polishing rate can be increased and tool efficiency can be improved. However, due to stable chemical properties of silicon carbide materials, a meaningful silicon carbide chemical mechanical polishing process requires a strong oxidizing slurry, which posts a significant challenge on corrosion resistance of equipment hardware, thus affects the equipment reliability and manufacturing cost. For conductive silicon carbide substrate materials, in order to overcome the issues in conventional chemical mechanical polishing/planarization process, an electrochemical mechanical polishing/planarization process can be adopted. In a silicon carbide electrochemical mechanical polishing process, silicon carbide surface can be oxidized through electrochemical reactions. If a considerable current density can be achieved, surface oxidation of silicon carbide materials can be significantly accelerated. Coupled with a simultaneous (chemical) mechanical polishing, the removal rate of silicon carbide materials can be significantly increased, equipment operation efficiency can be improved and cost can be reduced accordingly. Meanwhile, the electrochemical mechanical polishing process does not need to rely on a strong oxidizing polishing slurry/electrolyte, the selection of equipment materials can be more forgiving, equipment costs can be reduced, the part lifetime can be increased, tool reliability and uptime can be improved, overall a further reduction in total process cost can be achieved.

Circuit architecture is critical in electrochemical mechanical polishing/planarization equipment design. At present, there is no electrochemical mechanical polishing/planarization equipment suitable for mass production in the market place. Existing electrochemical mechanical polishing/planarization tool setup can be roughly classified into two categories. The tools in the first category are based on conventional chemical mechanical polishing/planarization equipment design: a polishing table is disposed horizontally and can rotate circumferentially; a polishing pad is attached on upper surface of the polishing table, a liquid supply system delivers polishing slurry to the upper surface of the polishing pad; a wafer substrate carrier head (polishing head) is positioned above the polishing table/polishing pad, the wafer substrate is mounted face-down at bottom of the polishing head, the polishing head pushes down the wafer substrate to be in contact with the polishing pad, and the front surface of the wafer substrate is polished or planarized on the polishing pad. Based on the design of conventional chemical mechanical polishing/planarization equipment, a circuit architecture of electrochemical mechanical polishing/planarization equipment through surface of a conductive wafer substrate can be established by modification the polishing table and polishing pad: a conductive polishing table can be connected to the first lead of the power supply, the polishing pad attached to the polishing table itself can be made of insulating material but consists of holes penetrating throughout its thickness, with the holes filled with a slurry-electrolyte mixture which is conductive. Meanwhile, multiple conductive contacts can be additionally disposed on the upper surface of the insulating polishing pad, and rotate with the polishing pad. The conductive contacts are usually made of metal conductors. They can be connected to one another and finally connected to the second lead of the power supply. When electrochemical mechanical polishing/planarization equipment of the first category is in operation, the wafer moves together with the wafer substrate carrier head (polishing head), the polish head pressurizes the back of the wafer substrate, the front surface of the wafer substrate is in full contact with the polishing pad on the polish table, and the slurry-electrolyte mixture in the holes of the polishing pad are in electrical contact with both the front surface of the conductive wafer substrate and the conductive polishing table. As a result, an electrical circuit is completed between the first lead of the power supply—the conductive polishing table—the conductive slurry-electrolyte mixture in the holes of the polishing pad—the front surface of the conductive wafer substrate—the conductive contacts on the upper surface of the polishing pad—the second lead of the power supply. With this circuit design, electrochemical mechanical polishing/planarization equipment is suitable for polishing both conductive wafer substrates as well as insulating wafer substrate with a conductive surface layer. The main challenges in this electrochemical mechanical polishing/planarization equipment configuration is the materials selection and design of the conductive contacts disposed on the upper surface of the polishing pad. Common problems can include surface scratch, particle contamination and metal contamination on the wafer substrate caused by the conductive contacts. Additional issues can include chemical stability and wear of the conductive contacts, reliability of the electrical contact between the conductive contacts and the wafer substrate, durability and cost of the polishing pad, etc.

The design of electrochemical mechanical polishing/planarization equipment in the second category is based on conventional mechanical thinning and surface polishing tools: a wafer substrate is disposed horizontally and faces upward on a polishing table, a polishing head is positioned above the polishing table/wafer substrate. A polishing pad is attached to the bottom of the polishing head, and the polish pad does not need to have any hole through its thickness direction. When rotating together, the polishing head and polishing pad pressurize the front surface of the wafer substrate to perform thinning or surface polishing on the wafer substrate. In the electrochemical mechanical polishing/planarization equipment of the second category, the conductive wafer substrate is connected to the first lead of a power supply through the polishing table. Meanwhile, the polishing table, the wafer substrate and the lower part of the polishing head are all immersed in a conductive chemical liquid and can be connected to the second lead of the power supply through a conducting electrode which is also immersed in the conductive chemical liquid. With such tool configuration, a conductive loop can be completed between the first lead of the power supply—the polishing table—the conductive wafer substrate—the conductive chemical liquid—the conducting electrode immersed in the conductive chemical liquid—the second lead of the power supply. In the electrochemical mechanical polishing/planarization equipment of the second category, the wafer substrate is completely immersed in the conductive chemical liquid, a certain depth of the conductive chemical liquid is usually required to accommodate the conducting electrode, thus it is difficult to quickly and effectively remove by-products generated in the electrochemical polishing of the surface of the wafer substrate. A quick loading and unloading of the wafer substrate can also be difficult.

SUMMARY

To overcome the deficiencies of the prior art, the invention provides a new design of electrochemical mechanical polishing and planarization equipment, which can realize a conductive wafer substrate polishing and planarization process of high performance, high efficiency and low cost.

The technical solution adopted by the invention is an electrochemical mechanical polishing and planarization equipment for processing a conductive wafer substrate, which includes the followings:

a power supply including a first lead and a second lead;

a polishing table connected to the first lead and having conductivity;

a polishing pad disposed on an upper surface of the polishing table, where the polishing pad at least comprises an active layer in a physical contact with a polishing surface of the conductive wafer substrate, the active layer is made of an insulating material, the active layer comprises holes penetrating through a thickness direction of the active layer, and a conductive chemical liquid is accommodated in the holes; and a polishing head connected to the second lead and having conductivity, where a back of the polishing surface of the conductive wafer substrate is attached to a lower surface of the polishing head, where the first lead, the polishing table, the conductive chemical liquid, the conductive wafer substrate, the polishing head, and the second lead in sequence complete a conductive loop to form an electrochemical reaction layer on the polishing surface of the conductive wafer substrate, and where the polishing head drives the conductive wafer substrate to move relative to the polishing pad to perform a mechanical polishing or a chemical mechanical polishing of the electrochemical reaction layer.

Further, the polishing table rotates around an axis of the polishing table; the polishing head rotates around an axis of the polishing head and moves relative to the polishing table.

Further, the number of the holes is plural.

Further, the total area of the holes accounts for 5-70% of the total area of the active layer.

Further, the polishing pad is the active layer; or the polishing pad is a double-layer structure or a multi-layer structure, an uppermost layer of the polishing pad is the active layer, and one or more layers of a lower part of the polishing pad are an insulating layer, and the holes penetrate the entire thickness direction of the polishing pad.

Further, the polishing pad is a double-layer structure or a multi-layer structure, an uppermost layer of the polishing pad is the active layer, one or more layers of a lower part of the polishing pad are a conductive layer.

Further, a formation of the electrochemical reaction layer on the polishing surface of the conductive wafer substrate and an operation of the mechanical polishing or the chemical mechanical polishing of the electrochemical reaction layer are performed simultaneously; or the formation of the electrochemical reaction layer on the polishing surface of the conductive wafer substrate and the operation of the mechanical polishing or the chemical mechanical polishing of the electrochemical reaction layer are performed alternately.

Further, the polishing head includes the following:
a first pressure medium cavity configured to control an upward movement and a downward movement of the conductive wafer substrate; and
a second pressure medium cavity configured to control a suction component, where the suction component clamps or releases the conductive wafer substrate by changing an air pressure inside the second pressure medium cavity,
where the suction component includes a deformable flexible component and a supporting component for supporting the flexible component, and an access point to the power supply is disposed on the suction component.

Further, the flexible component is a conductive flexible film, the supporting component is a metal component, and the metal component forms the access point to the power supply.

Further, the flexible component is an insulating flexible film, a conductive coil is enclosed in the flexible component, and the conductive coil forms the access point to the power supply.

Further, the polishing table includes an upper polishing disc and a lower polishing disc, which are disposed concentrically and coaxially, and the lower polishing disc is connected to a central rotation shaft.

Further, the upper polishing disc is made of metal material or alloy material.

Further, a wire connected to the power supply passes through the central rotation shaft and is connected to the upper polishing disc.

Further, the polishing table has a heating or cooling function.

Further, a chemical liquid supply system is further included for delivering the chemical liquid to an upper surface of the polishing pad.

Further, a chemical liquid supply system is further included for delivering the chemical liquid from the upper polishing disc to a bottom of the holes.

Further, the chemical liquid is a polishing slurry, in which abrasive nanoparticles are dispersed in an acidic or basic solution, and the chemical liquid has a pH of greater than 8 or less than 5.

Further, when the electrochemical reaction layer is formed on the polishing surface of the conductive wafer substrate, the second lead connected to the conductive wafer substrate through the polishing head is positive, and the first lead connected to the polishing table is negative.

Further, the power supply is a current control power supply with a current≤20A; or the power supply is a voltage control power supply with a voltage≤220V.

Further, an edge of the polishing table outside the polishing pad or an edge of the polishing pad has a barrier, and a height of the barrier relative to an upper surface of the polishing pad is less than or equal to 3 mm.

Further, the holes are circular, rectangular, regular hexagonal, or of a star shape, and the holes are distributed in arrays or concentric circles.

The invention relates to a new circuit architecture design of electrochemical mechanical polishing/planarization equipment. Similar to electrochemical mechanical polishing/planarization equipment in the first category, a polishing table is connected to the first lead of a power supply with an electrical pathway to the upper surface of the polish table. A polishing pad of insulating material is attached to the upper surface of a conductive polishing table, and the polishing pad has holes penetrating through its thickness direction. A liquid supply system dispenses a conductive chemical liquid to the polishing pad, and the chemical liquid is accommodated in the holes of the polishing pad. Different from the electrochemical mechanical polishing/planarization equipment of the first category, additional conductive electrical contacts on the polishing pad are not required. Rather an electrical pathway from the conductive wafer to the second lead of the power supply is designed through the wafer substrate carrier head (polishing head). When the polishing head pressurizes the back of the wafer, the front surface of the wafer substrate is in contact with the polishing pad and thus the chemical liquid accommodated in the holes, and a conductive loop of the first lead of power supply—the conductive polishing table—the chemical liquid in the holes that penetrate the thickness of the polishing pad—the conductive wafer substrate—the polishing head—the second lead of the power supply is completed. The polarity of the first and the second leads of the power supply are determined by the nature of electrochemical reactions on the wafer substrate front surface. In an example of an electrical chemical mechanical polishing process of conductive silicon carbide wafer substrates, the surface of the conductive silicon carbide wafer substrate is oxidized. The substrate is attached to the bottom of the polishing head, thus the polishing head serves as anode. The polishing pad is attached to the polishing table, the chemical liquid in the holes of the polishing pad serves as electrolyte, and the polishing table serves as cathode.

In the proposed electrochemical mechanical polishing/planarization process of the conductive wafer substrate, the polishing pad is attached to the upper surface of the polishing table, and rotates together with the polishing table around the axis of the polishing table. The substrate is mounted upside down at bottom of the polishing head, rotates together with the polishing head rotates around the axis of the polishing head, and moves relative to the polishing pad/polishing table. An electrochemical reaction occurs on the surface of the conductive wafer substrate with the substrate passing through the hole area on the polishing pad, and mechanical polishing/planarization or chemical mechanical polishing/planarization is performed with the substrate passing through the non-hole area on the polishing pad. When the wafer substrate rotates with the polishing head and moves relative to the polishing table, the alternating electrochemical reaction and (chemical) mechanical polishing/planarization process can be continuously and repeatedly completed on the surface of the conductive wafer substrate, thus accomplishing the electrochemical mechanical polishing/planarization of the conductive wafer substrate.

The benefits of the invention include: 1) compared with mechanical polishing or conventional chemical mechanical polishing/planarization process, in the electrochemical mechanical polishing/planarization of a conductive wafer substrate, with an introduction of electrochemical reactions on the surface of the wafer substrate, the substrate material removal and polishing/planarization rates are significantly improved, and the equipment operation cost is significantly reduced; 2) compared with the electrochemical mechanical polishing/planarization equipment in the first category, the circuit design is simpler with no conductive electrical contacts on the surface of the polishing pad which can yield a significant reduction in wafer substrate polishing surface defectivity, a significant reduction in substrate surface metal and particle contamination, a significant increase in the polishing pad lifetime and a significant reduction in total cost of consumables; 3) compared with the electrochemical mechanical polishing/planarization equipment in the second category, the electrochemical reaction and subsequent (chemical) mechanical polishing rate can be independently controlled and adjusted in the electrochemical mechanical polishing process, including independent control of different zones on the wafer substrate surface. In addition, wafer loading/unloading can be rather straight-forward, in a manner similar to existing conventional chemical mechanical polishing/planarization equipment.

DESCRIPTION OF THE EMBODIMENTS

Figure 1:
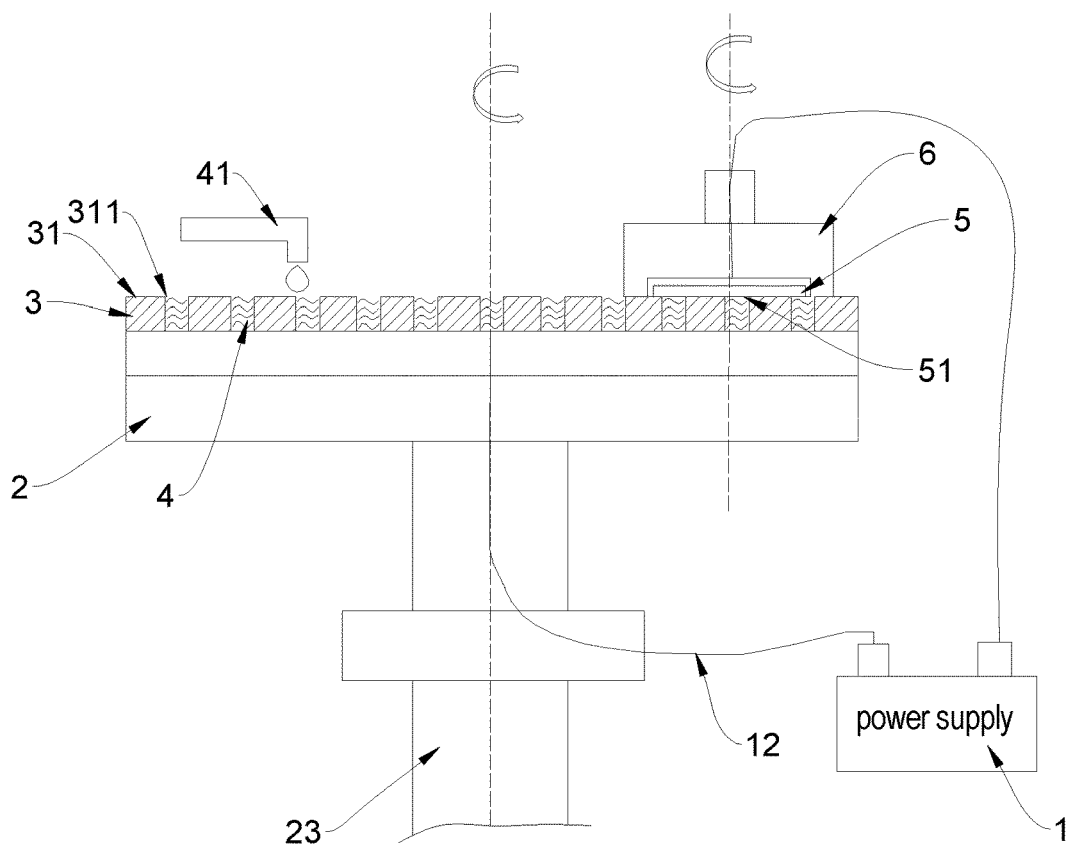
FIG. 1 is a structural schematic view of the invention.

For those skilled in the art to better understand the invention, the technical solutions in the embodiments of the invention will be clearly and completely described below with reference to the drawings in the embodiments of the invention. Obviously, the described embodiments are only some but not all embodiments of the invention. Based on the embodiments of the invention, all other embodiments obtained by persons of ordinary skill in the art without making creative efforts shall fall within the protection scope of the invention.

An electrochemical mechanical polishing/planarization equipment for processing a conductive wafer substrate includes a power supply 1, a conductive polishing table 2 connected to the first lead of the power supply 1, a polishing pad 3 disposed on the upper surface of the polishing table 2, and a conductive polishing head 6 connected to the second lead of the power supply 1. A conductive wafer substrate 5 is mounted upside down at bottom of the polishing head 6, with the back surface of a polishing surface 51 in contact with the bottom of the polishing head 6.

In the embodiment, the first lead is negative, and the second lead is positive. In other embodiments, it is also possible that the first lead is positive and the second lead is negative.

The polishing table 2 may rotate around its own axis of the polishing table. At the same time, the polishing head 6 may rotate around its own axis of the polishing head and move relative to the polishing table 2.

The power supply 1 provides a constant current or a constant voltage for the electrochemical circuit; the power supply 1 may be a current control power supply with a current≤20A; or the power supply 1 may be a voltage control power supply with a voltage≤220V.

The polishing pad 3 at least includes an active layer 31 that may be in contact with the polishing surface 51 of the conductive wafer substrate 5. The active layer 31 is made of an insulating material and has a plurality of holes 311 that penetrate through the thickness direction. A chemical liquid 4 is accommodated in the holes 311, and the chemical liquid 4 is conductive. An electrochemical reaction occurs on the polishing surface 51 of the conductive wafer substrate in the hole area of the active layer 31, and chemical mechanical polishing is performed on the polishing surface 51 of the conductive wafer substrate 5 in the non-hole area of the active layer 31.

Both the step in which electrochemical reaction takes place on the polishing surface 51 of the conductive wafer substrate 5 in the hole area of the active layer 31 to form an electrochemical reaction layer and the step in which mechanical polishing or chemical mechanical polishing is performed on the polishing surface 51 of the conductive wafer substrate 5 in the non-hole area of the active layer 31 may be carried out simultaneously, that is, an electrochemical reaction in the hole area occurs to form an electrochemical reaction layer while chemical mechanical polishing is performed in other non-hole areas. With the conductive wafer substrate 5 rotates with the polishing head 6 relative to the polishing pad 3 which is attached to the polishing table 2, these two steps may be alternated on the conductive wafer substrate polishing surface 51, that is, the polishing surface 51 first undergoes an electrochemical reaction in the hole area of the active layer 31 to form an electrochemical reaction layer, then a mechanical polishing or a chemical mechanical polishing is performed on the non-hole area of the active layer 31, and the steps are repeated again.

By polishing head 6 applying a downward pressure on the back of the conductive wafer substrate 5, the power supply 1, the polishing table 2, the chemical liquid 4, the conductive wafer substrate 5, the polishing head 6, and the power supply 1 in sequence form a conductive loop, so that the polishing surface 51 of the conductive wafer substrate 5 reacts electrochemically with the conductive chemical liquid 4 in a large number of holes 311 distributed on the polishing pad 3, and an electrochemical reaction layer is formed on the polishing surface 51 of the conductive wafer substrate 5 accordingly. When the polishing head 6 drives the conductive wafer substrate 5 to move relative to the polishing pad 3, the electrochemical reaction layer interacts with the non-hole region of the active layer 31, thereby implementing (chemical) mechanical polishing of the electrochemical reaction layer.

Figure 2:
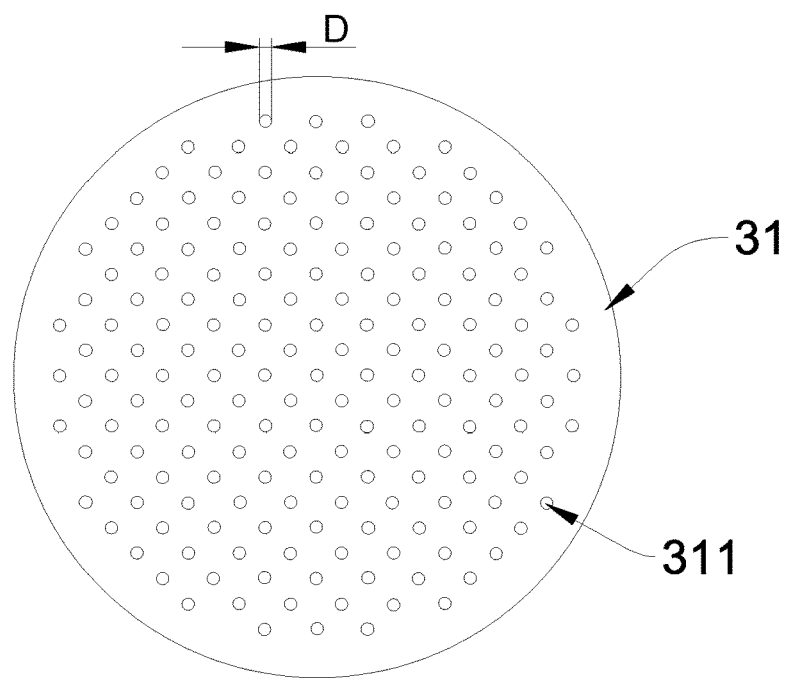
FIG. 2 is a top view of an active layer in the invention.

As shown in FIG. 2, there can be multiple holes 311 with a diameter greater than or equal to 3 mm, that is, D≥3 mm in FIG. 2. The holes 311 may be circular and distributed in arrays or concentric circles. The holes 311 may also be in any other shapes and may be randomly distributed. The total area of the holes 311 may account for 5-70% of the total area of the active layer 31. With such an area ratio, electrochemical reaction rate can be optimized, and the rate the electrochemical reaction layer formation can match with rate of the (chemical) mechanical polishing.

The shape of the holes 311 is not restricted, and the shape may also be rectangular, regular hexagonal, or of a star shape.

Figure 3:
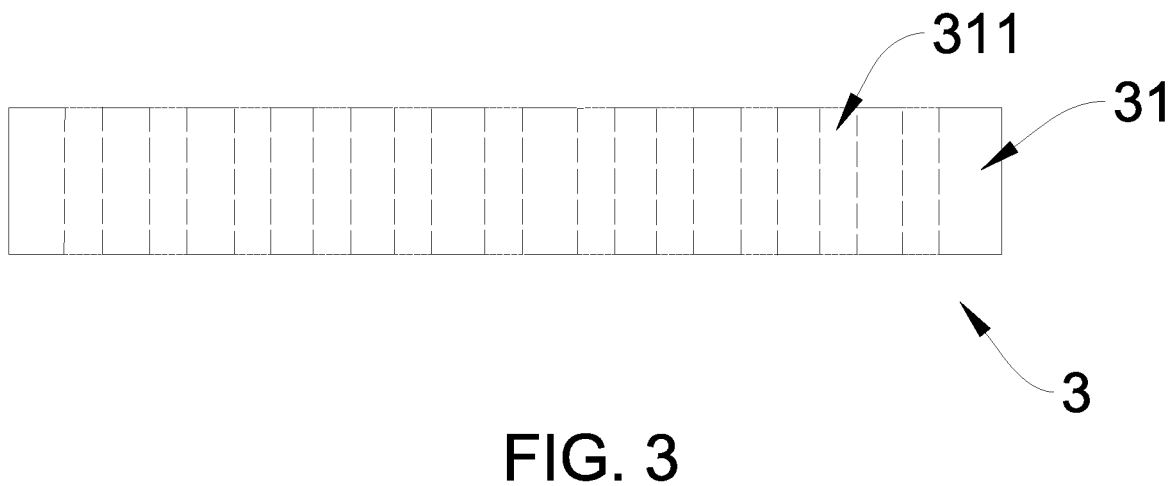
FIG. 3 is a cross-sectional view of a polishing pad in the invention, and the polishing pad has a single-layer structure.

The polishing pad 3 may be an insulating polishing pad with a single-layer structure, and the entire polishing pad 3 is the active layer 31, as shown in FIG. 3.

Figure 4:
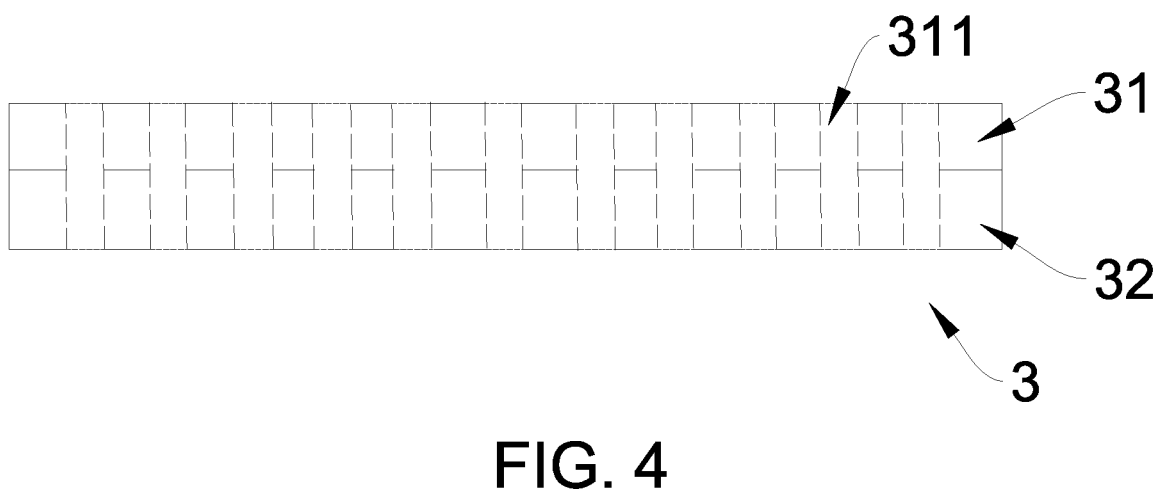
FIG. 4 is a cross-sectional view of the polishing pad in the invention, the polishing pad has a double-layer structure, and the lower layer is an insulating layer.

The polishing pad 3 may also be a double-layer structure or a multi-layer structure. Regardless of being a double-layer structure or a multi-layer structure, the uppermost layer of the polishing pad 3 is active layer 31, and one or more layers of the lower part of the polishing pad 3 are an insulating layer 32. The holes 311 penetrate the entire thickness direction of the polishing pad 3, that is, the holes 311 extend downward from the active layer 31 to the insulating layer 32, as shown in FIG. 4.

Figure 5:
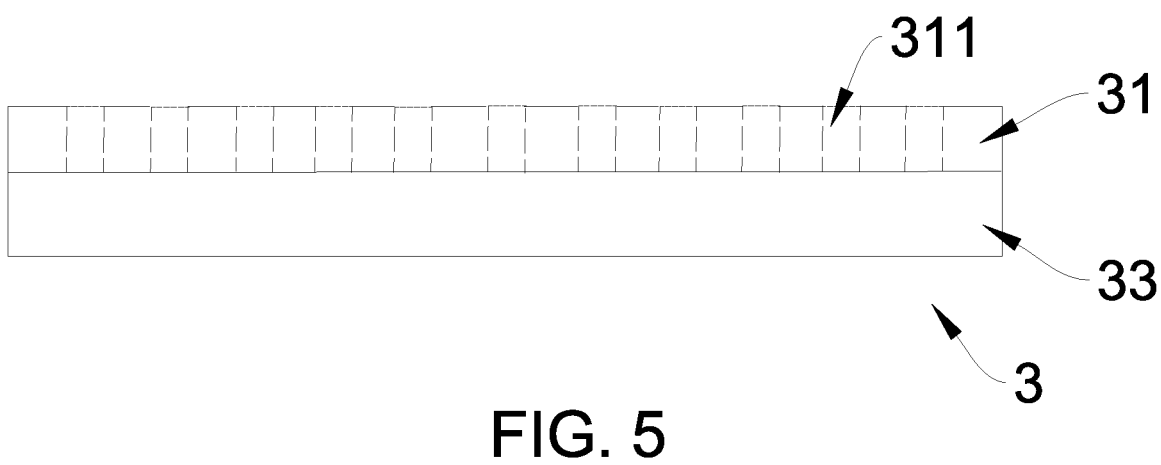
FIG. 5 is a cross-sectional view of the polishing pad in the invention, the polishing pad has a double-layer structure, and the lower layer is a conductive layer.

The polishing pad 3 may also be a double-layer structure or a multi-layer structure. Regardless of being a double-layer structure or a multi-layer structure, the uppermost layer of the polishing pad 3 is the active layer 31, and one or more layers of the lower part of the polishing pad 3 are conductive layer 33. The conductive layer 33 may be fully solid, as shown in FIG. 5; or the conductive layer 33 may have openings, and the openings of the conductive layer 33 can connect with the holes 311 on the active layer 31.

Figure 6:
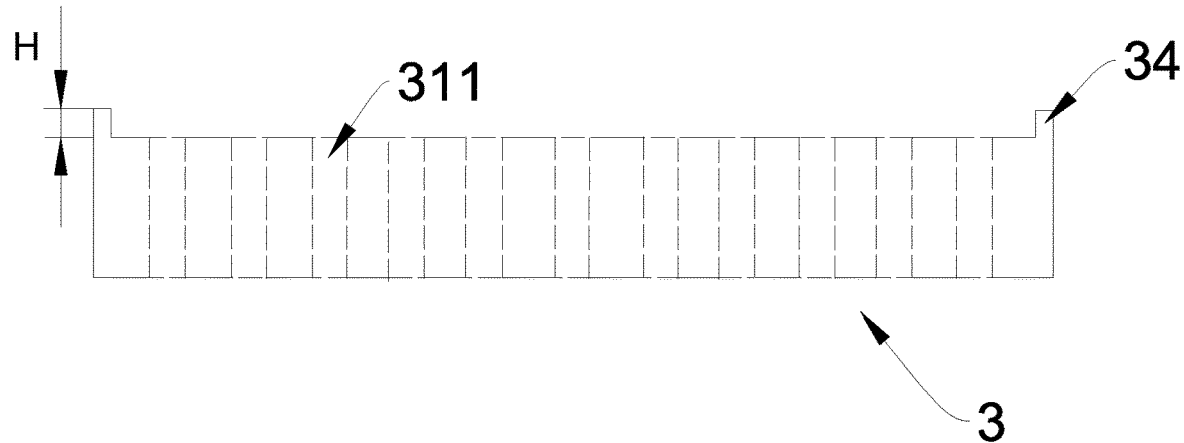
FIG. 6 is a cross-sectional view of the polishing pad in the invention, the outer edge thereof has a barrier, and the barrier is made of homogeneous materials.
Figure 7:
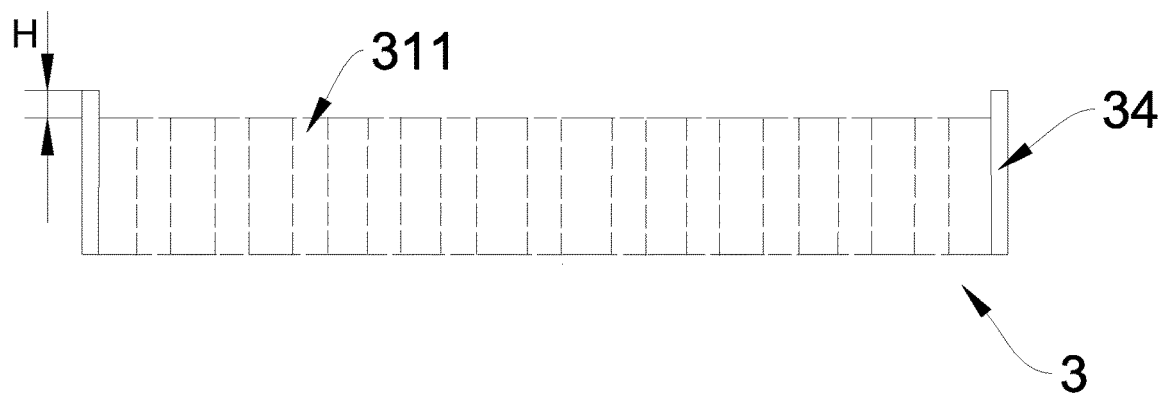
FIG. 7 is a cross-sectional view of the polishing pad in the invention, the outer edge thereof has a barrier, and the barrier is made of heterogeneous materials.

Outer edge of the polishing table 2 or the edge of the polishing pad 3 may have a barrier 34, and the barrier 34 protrudes upwards from the upper surface of the polishing pad 3 with a height H of ≤3 mm relative to the upper surface of the polishing pad, that is, the barrier 34 is about ≤3 mm higher than the upper surface of the polishing pad 3. As shown in FIG. 6, the barrier 34 may be an edge-high structure of the same material as the polishing pad 3. As shown in FIG. 7, the barrier 34 may also be an edge-high structure at the outer edge of the polishing pad 3 and made of a heterogeneous material, and the heterogeneous material barrier 34 may be a hard and corrosion-resistant material such as plastic, or a flexible material such as rubber.

Figure 8:
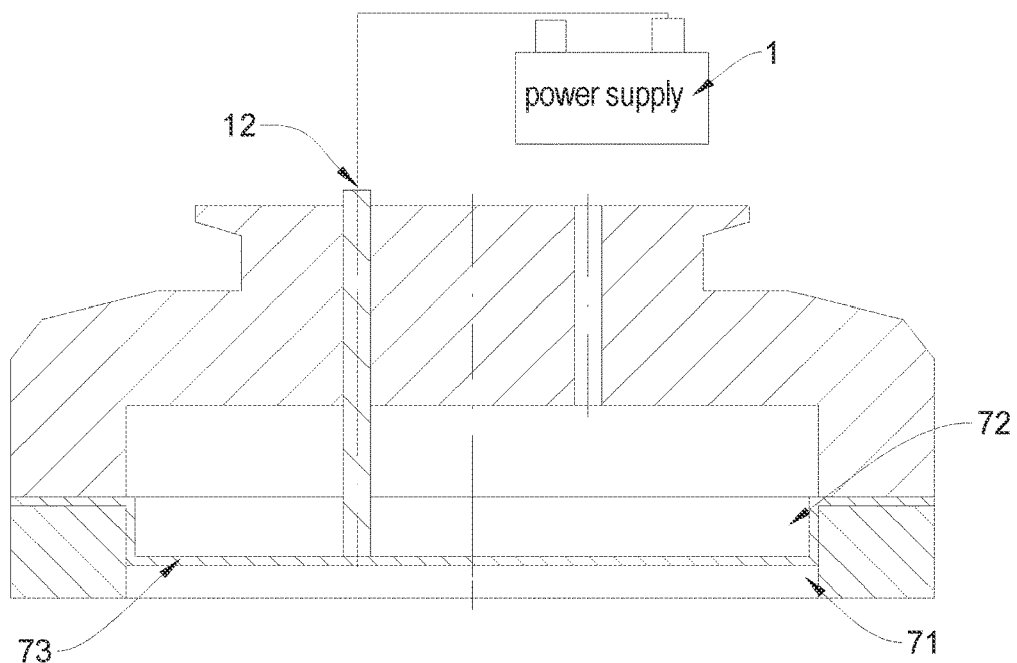
FIG. 8 is a cross-sectional view of the polishing head in the invention.
Figure 9:
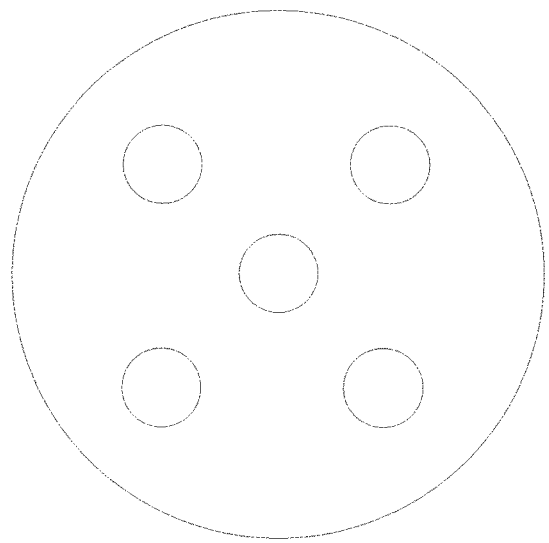
FIG. 9 is a top view of a lightweight metal plate in the invention.
Figure 10:
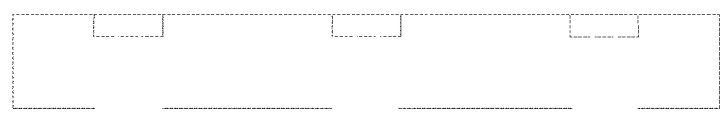
FIG. 10 is a cross-sectional view of a lightweight metal plate in the invention.

As shown in FIG. 8, the polishing head 6 may include a first pressure medium cavity 71 for controlling an up-down movement of the conductive wafer substrate 5, and at least one second pressure medium cavity 72 for controlling a suction component 73. By changing the air pressure inside the second pressure medium cavity 72, that is, changing the shape or the movement of the suction component 73 by pressurizing or vacuuming the second pressure medium cavity 72, the suction component 73 may directly clamp the conductive wafer substrate 5 so that it is directly connected to a back of the polishing surface of the conductive wafer substrate 5, or release the conductive wafer substrate 5, and the implementation of specific functions is in the prior art and may not be elaborated herein.

Figure 11:
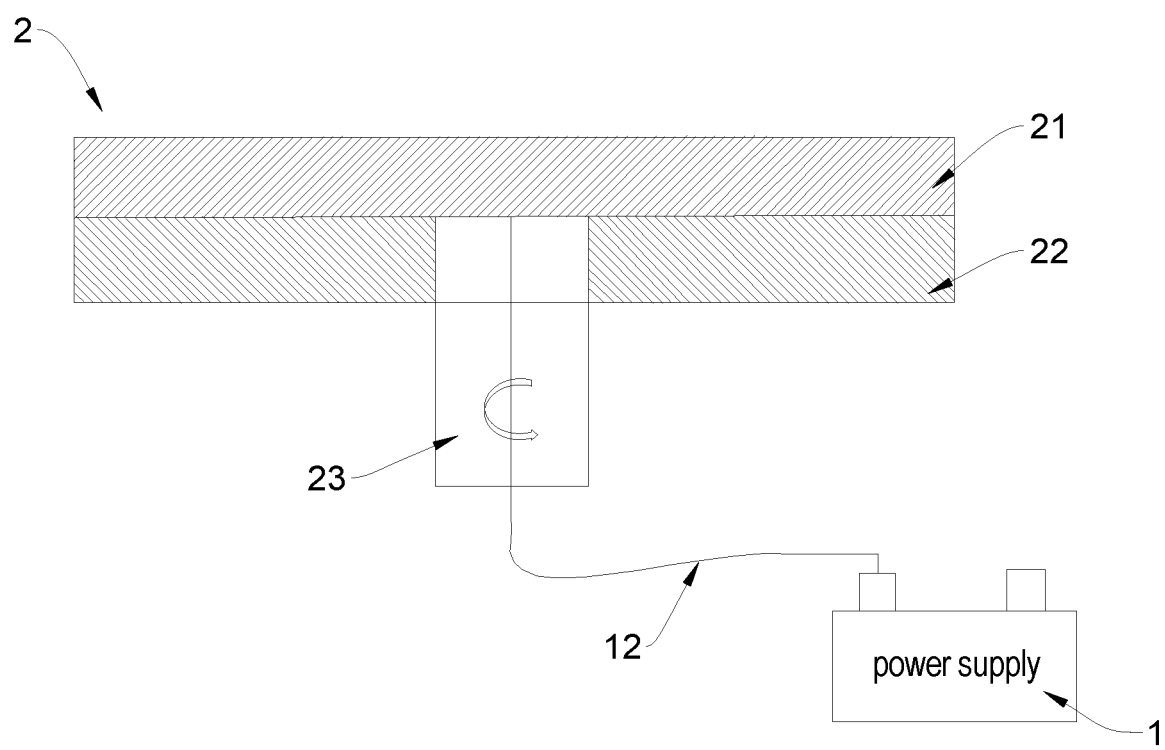
FIG. 11 is a schematic structural view of the polishing table in the invention.

As shown in FIG. 11, the polishing table 2 includes an upper polishing disc 21 and a lower polishing disc 22, which are both disposed concentrically and coaxially with the central rotation shaft 23, and the lower polishing disc 22 is connected to the central rotation shaft 23. A mechanism may drive the upper polishing disc 21 and the lower polishing disc 22 to rotate coaxially, and the rotation speed is controllable.

The polishing pad 3 is attached on the upper surface of the upper polishing disc 21 and in direct contact with the polishing surface 51 of the conductive wafer substrate 5. The holes 311 on the polishing pad 3 and the chemical liquid 4 provide pathways for electrochemical reactions to occur. The non-hole area of the polishing pad 3 provides a surface area for (chemical) mechanical polishing.

The upper polishing disc 21 may be made of metal material or alloy material, and a wire 12 connected to the power supply 1 may pass through the central rotation shaft 23 and be connected to the upper polishing disc 21. Specifically, the upper polishing disc 21 may be aluminum alloy or titanium alloy and may also be coated with a platinum layer.

The upper polishing disc 21 may be connected to a temperature control device, to implement a temperature control of the polishing pad based on a feedback of a temperature sensor of the polishing pad. The temperature control may include both heating and cooling. Heating or cooling may be implemented by adjusting the water temperature in a circulating water loop at the back of the upper polishing disc.

The circulating water system of the polishing disc may include one or more water inlets and one or more water outlets, and the circulating water loop may be an independent annular cavity or an interconnected cavity.

To supply the electrochemical mechanical polishing/planarization equipment with the required chemical liquid, a chemical liquid supply system may be further included. The chemical liquid supply system may be used to deliver the chemical liquid 4 to the upper surface of the polishing pad 3. Through a rotation of the polishing table 2, the chemical liquid supply system can evenly distribute the chemical liquid 4 into the holes 311 of the polishing pad 3. In another embodiment, the chemical liquid supply system may deliver the chemical liquid 4 from the upper polishing disc 21 to the bottom of the holes 311, with the upper polishing disc 21 having liquid supply channels.

Such a chemical liquid supply system 41 may also be equipped with a flow control unit to control flow of the chemical liquid dispensed onto the polishing pad; or the chemical liquid supply system 41 may also be equipped with a temperature control unit, to control temperature of the chemical liquid dispensed onto the polishing pad; or the chemical liquid supply system 41 may also be equipped with a concentration control unit, to adjust concentration of the chemical liquid dispensed onto the polishing pad.

The chemical liquid 4 may be a polishing slurry, specifically formulated by dispersing abrasive nanoparticles in an acidic or basic solution, with a pH>8 or pH<5. The chemical liquid 4 may also be a mixed solution of a polishing slurry and an electrolyte, and the electrolyte provides the polishing slurry with anions and cations required for electrical conductivity. An oxidizing solvent, such as potassium permanganate or hydrogen peroxide, may be added to the chemical liquid 4.

The implementation method of using the electrochemical mechanical polishing/planarization equipment includes steps as follows.

(a) The conductive polishing head loads the conductive wafer substrate from a loading station by controlling pressure of the second pressure medium cavity in the polishing head, and transports the conductive wafer substrate to above the electrochemical polishing pad attached to the top of the polishing table.

(b) The chemical liquid supply system delivers the chemical liquid to the top of the polishing pad, and the chemical liquid can be evenly distributed by a pad conditioner into the grooves and holes of the polishing pad that rotates coaxially with the polishing table.

(c) Airbags in the first pressure medium cavity and the second pressure medium cavity of the polishing head are pressurized, and the conductive wafer substrate is pressed down onto the polishing pad together with the flexible component. The back of the conductive wafer substrate is in contact with the flexible component and is electrically connected to the second lead of the power supply through the central rotation shaft of the polishing head. The polishing surface of the conductive wafer substrate is in contact with the polishing pad and the chemical liquid in the holes of the polish pad, the chemical liquid is in contact with the upper polishing disc of the polishing table, and a wire the upper polishing disc of the polishing table may be connected to the first lead of the power supply through a central rotation shaft of the polishing table to complete an electrical circuit for the electrochemical mechanical polishing/planarization. For wafer substrates with conductivity on the polishing surface, an alternating current can be applied onto a conductive coil enclosed in the flexible component, so that an Eddy current can be generated on the conductive wafer substrate surface, thus to establish an electrical current between the wafer substrate and the polishing table.

(d) Through the rotation and a swing motion of the polishing head and the rotation of the polishing pad, the polishing surface of the conductive wafer substrate is in contact with the chemical liquid in the holes.

(e) With the electrical current and the chemical liquid, an electrochemical reaction takes place on the polishing surface of the conductive wafer substrate to form an electrochemical reaction layer.

(f) With the rotation of the polishing head and its move across the polishing pad which rotates together with the polishing table, the polishing surface of the conductive wafer substrate alternates between the electrochemical reaction contact point and the (chemical) mechanical polishing point, the electrochemical reaction layer may be mechanically polished or chemical-mechanically polished in the non-hole area; after the electrochemical reaction layer is polished, the conductive wafer substrate surface may be moved to the hole area to form an electrochemical reaction layer again; the electrochemical reaction layer may be mechanically polished or chemical-mechanically polished in the non-hole area again, so on the so forth.

(g) Step (d) to step (f) continue until the polishing removal amount target is reached.

(h) The polishing head controls the pressure of the first pressure medium cavity and second pressure medium cavity, the conductive wafer substrate can be clamped to the polishing head and can be moved to an unloading station, and by controlling the pressure of the first pressure medium cavity and the second pressure medium cavity, the conductive wafer substrate can be unloaded.

The specific embodiments are used to explain the invention rather than to limit the invention. Within the spirit of the invention and the protection scope of the claims, any modification and change made to the invention will fall into the protection scope of the invention.

What is claimed is:

1. An electrochemical mechanical polishing/planarization equipment for processing a conductive wafer substrate, comprising:
   a power supply comprising a first lead and a second lead;
   a polishing table connected to the first lead and having conductivity, wherein the polishing table comprises an upper polishing disc and a lower polishing disc, which are disposed concentrically and coaxially, and the lower polishing disc is connected to a central rotation shaft, and wherein the first lead passes through the central rotation shaft to be directly connected to the upper polishing disc of the polishing table;
   a polishing pad disposed on an upper surface of the polishing table, wherein the polishing pad comprises at least an active layer in contact with a polishing surface of the conductive wafer substrate, the active layer is made of an insulating material, the active layer comprises holes penetrating through a thickness direction of the active layer, and an electrically conductive chemical liquid is accommodated in the holes, wherein a total area of the holes account for 5% to 70% of a total area of the active layer; and
   a polishing head connected to the second lead and having conductivity, wherein a lower surface of the polishing head includes a suction component that directly clamps the conductive wafer substrate so that it is directly connected to a back of the polishing surface of the conductive wafer substrate, and wherein the second lead passes through another central rotation shaft located on a backside of the polishing head, and passes through the suction component to be electrically connected to the back of the polishing surface of the conductive wafer substrate,
   wherein the first lead, the polishing table, the electrically conductive chemical liquid, the polishing surface of the conductive wafer substrate, the conductive wafer substrate, the back of the polishing surface of the conductive wafer substrate, the polishing head, and the second lead in sequence form a conductive loop to form an electrochemical reaction layer on the polishing surface of the conductive wafer substrate, and
   wherein the polishing head drives the conductive wafer substrate to move relative to the polishing pad to perform a chemical mechanical polishing of the electrochemical reaction layer.

2. The electrochemical mechanical polishing/planarization equipment for processing the conductive wafer substrate according to claim 1, wherein the polishing table rotates around an axis of the polishing table; the polishing head rotates around an axis of the polishing head and moves relative to the polishing table.

3. The electrochemical mechanical polishing/planarization equipment for processing the conductive wafer substrate according to claim 1, wherein the polishing pad is the active layer; or the polishing pad is a double-layer structure or a multi-layer structure, an uppermost layer of the polishing pad is the active layer, and one or more layers of a lower part of the polishing pad are an insulating layer, and the holes penetrate an entire thickness direction of the polishing pad.

4. The electrochemical mechanical polishing/planarization equipment for processing the conductive wafer substrate according to claim 1, wherein the polishing pad is a double-layer structure or a multi-layer structure, an uppermost layer of the polishing pad is the active layer, one or more layers of a lower part of the polishing pad are a conductive layer, and the conductive layer is fully solid or comprises openings in connection with the holes.

5. The electrochemical mechanical polishing/planarization equipment for processing the conductive wafer substrate according to claim 1, wherein the polishing head comprises:
   a first pressure medium cavity configured to control an upward movement and a downward movement of the conductive wafer substrate; and
   a second pressure medium cavity configured to control the suction component, wherein the suction component clamps or releases the conductive wafer substrate by changing an air pressure inside the second pressure medium cavity, wherein the suction component comprises a deformable flexible component and a supporting component for supporting the flexible component, and an access point for the power supply is disposed on the suction component.

6. The electrochemical mechanical polishing/planarization equipment for processing the conductive wafer substrate according to claim 5, wherein the flexible component is a conductive flexible film, the supporting component is a metal component, and the metal component forms the access point for the power supply.

7. The electrochemical mechanical polishing/planarization equipment for processing the conductive wafer substrate according to claim 5, wherein the flexible component is an insulating flexible film, a conductive coil is enclosed in the flexible component, and the conductive coil provides the access point for the power supply.

8. The electrochemical mechanical polishing/planarization equipment for processing the conductive wafer substrate according to claim 1, wherein the upper polishing disc is made of metal material or alloy material.

9. The electrochemical mechanical polishing/planarization equipment for processing the conductive wafer substrate according to claim 1, wherein the polishing table comprises a heating or cooling function.

10. The electrochemical mechanical polishing/planarization equipment for processing the conductive wafer substrate according to claim 1, further comprising a chemical liquid supply system configured to deliver the electrically conductive chemical liquid to the polishing pad, which delivers the electrically conductive chemical liquid to an upper surface of the polishing pad.

11. The electrochemical mechanical polishing/planarization equipment for processing the conductive wafer substrate according to claim 1, further comprising a chemical liquid supply system, which delivers the electrically conductive chemical liquid from the upper polishing disc to a bottom of the holes.

12. The electrochemical mechanical polishing/planarization equipment for processing the conductive wafer substrate according to claim 1, wherein the electrically conductive chemical liquid is a polishing slurry, in which abrasive nanoparticles are dispersed in an acidic or basic solution, and the electrically conductive chemical liquid has a pH of greater than 8 or less than 5.

13. The electrochemical mechanical polishing/planarization equipment for processing the conductive wafer substrate according to claim 1, wherein when the electrochemical reaction layer is formed on the polishing surface of the conductive wafer substrate, the second lead connected to the polishing head is positive, and the first lead connected to the polishing table is negative.

14. The electrochemical mechanical polishing/planarization equipment for processing the conductive wafer substrate according to claim 1, wherein the power supply is a current control power supply with a current$\leq$20A; or the power supply is a voltage control power supply with a voltage$\leq$220V.

15. The electrochemical mechanical polishing/planarization equipment for processing the conductive wafer substrate according to claim 1, wherein a barrier is disposed on an outer edge of polishing table or a barrier is formed on an outer edge of polishing pad, and a height of the barrier relative to an upper surface of the polishing pad is less than or equal to 3 mm.

16. The electrochemical mechanical polishing/planarization equipment for processing the conductive wafer substrate according to claim 1, wherein the holes are circular, rectangular, regular hexagonal, or of a star shape, and the holes are distributed in arrays or concentric circles.

* * * * *